(12) United States Patent
Daibou et al.

(10) Patent No.: US 9,117,995 B2
(45) Date of Patent: **\*Aug. 25, 2015**

(54) MAGNETORESISTANCE ELEMENT AND MAGNETIC MEMORY

(71) Applicant: KABUSHIKI KAISHA TOSHIBA, Minato-ku (JP)

(72) Inventors: Tadaomi Daibou, Yokohama (JP); Eiji Kitagawa, Yokohama (JP); Chikayoshi Kamata, Kawasaki (JP); Saori Kashiwada, Yokohama (JP); Yushi Kato, Chofu (JP); Megumi Yakabe, Kawasaki (JP)

(73) Assignee: KABUSHIKI KAISHA TOSHIBA, Minato-ku (JP)

( \* ) Notice: Subject to any disclaimer, the term of this patent is extended or adjusted under 35 U.S.C. 154(b) by 86 days.

This patent is subject to a terminal disclaimer.

(21) Appl. No.: 14/023,772

(22) Filed: Sep. 11, 2013

(65) Prior Publication Data

US 2014/0131649 A1 May 15, 2014

(30) Foreign Application Priority Data

Nov. 14, 2012 (JP) ................. 2012-250338

(51) Int. Cl.
*H01L 43/08* (2006.01)
*H01L 43/10* (2006.01)
*H01L 27/22* (2006.01)

(52) U.S. Cl.
CPC ............... *H01L 43/08* (2013.01); *H01L 43/10* (2013.01); *H01L 27/228* (2013.01)

(58) Field of Classification Search
CPC ....... H01L 43/08; H01L 43/12; H01L 27/222; G11C 11/14–11/16; G11C 11/161
See application file for complete search history.

(56) References Cited

U.S. PATENT DOCUMENTS

| 8,592,928 B2 * | 11/2013 | Hosotani et al. ............. 257/421 |
| 2009/0079018 A1 | 3/2009 | Nagase et al. |
| 2010/0244163 A1 | 9/2010 | Daibou et al. |
| 2012/0070695 A1 | 3/2012 | Kitagawa et al. |

(Continued)

FOREIGN PATENT DOCUMENTS

| JP | 2000-340860 A | 12/2000 |
| JP | 2002-359416 A | 12/2002 |

(Continued)

OTHER PUBLICATIONS

Office Action issued Feb. 4, 2014, in Japanese Patent Application No. 2012-250338 with English translation.
U.S. Appl. No. 13/729,297, filed Dec. 28, 2012, Eiji Kitagawa, et al.

*Primary Examiner* — Allison P Bernstein
(74) *Attorney, Agent, or Firm* — Oblon, McClelland, Maier & Neustadt, L.L.P.

(57) ABSTRACT

A magnetoresistance element includes a first magnetic layer having first and second surfaces, a second magnetic layer, an intermediate layer provided between the first surface and the second magnetic layer, a first layer provided on the second surface, containing B and at least one element selected from Hf, Al, Mg, and Ti and having third and fourth surfaces, a second layer provided on the fourth surface and containing B and at least one element selected from Hf, Al, and Mg, and an insulating layer provided on a sidewall of the intermediate layer and containing at least one element selected from the Hf, Al, and Mg contained in the second layer.

18 Claims, 6 Drawing Sheets

(56) References Cited

U.S. PATENT DOCUMENTS

| | | | |
|---|---|---|---|
| 2013/0307099 A1* | 11/2013 | Kitagawa et al. | 257/421 |
| 2014/0087483 A1* | 3/2014 | Ohsawa et al. | 438/3 |
| 2014/0131824 A1 | 5/2014 | Kitagawa et al. | |
| 2014/0284736 A1* | 9/2014 | Toko et al. | 257/421 |

FOREIGN PATENT DOCUMENTS

| | | |
|---|---|---|
| JP | 2009-81314 | 4/2009 |
| JP | 2012-199430 A | 10/2012 |
| JP | 2013-048210 A | 3/2013 |

\* cited by examiner

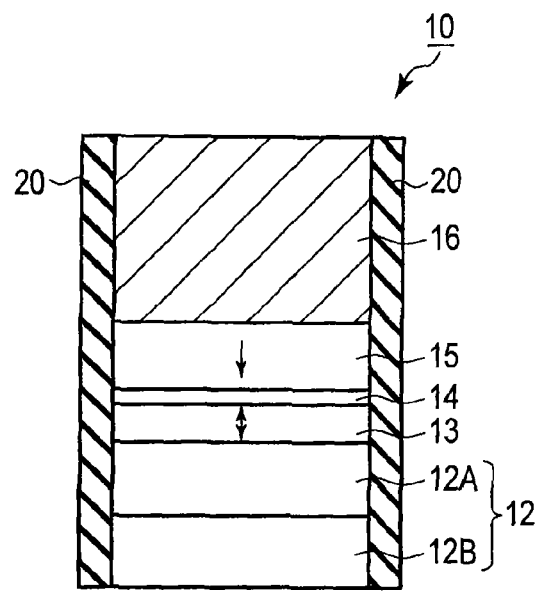
F I G. 1
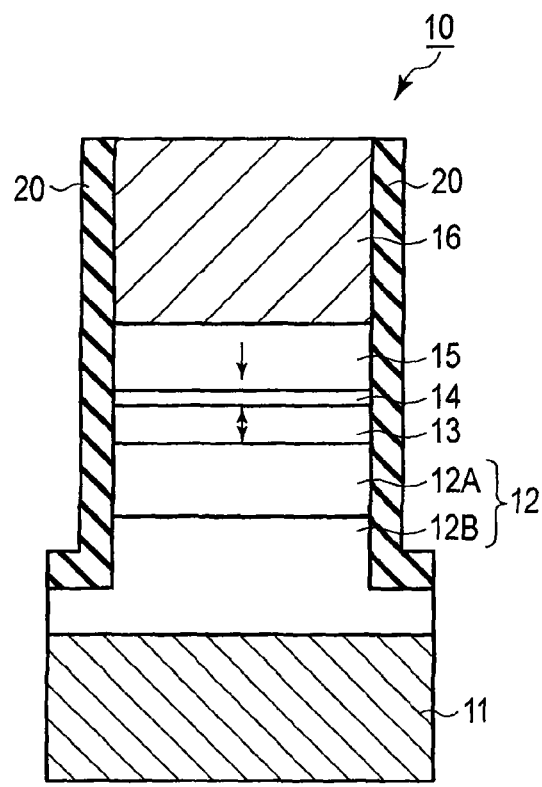
F I G. 2

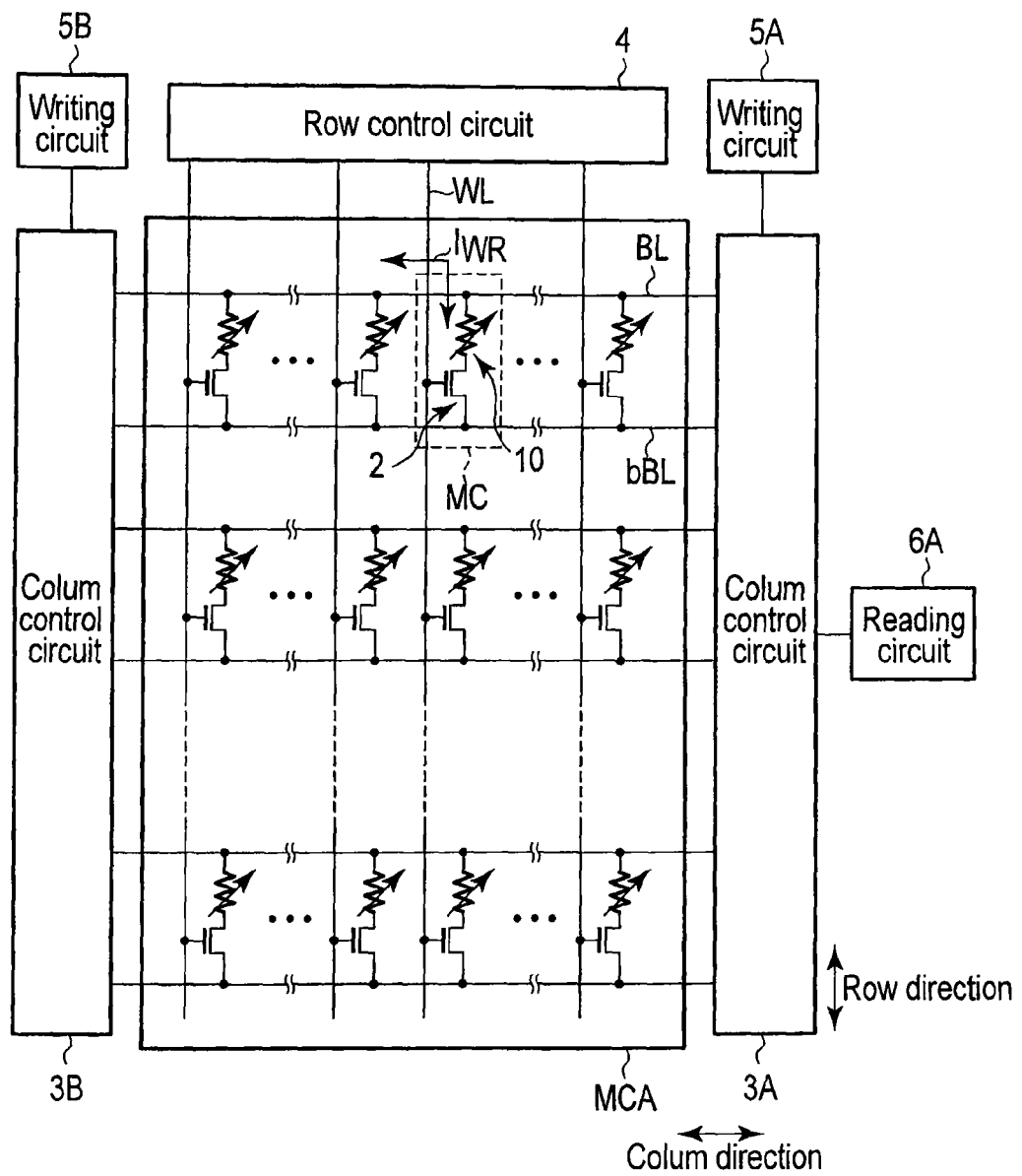
F I G. 8

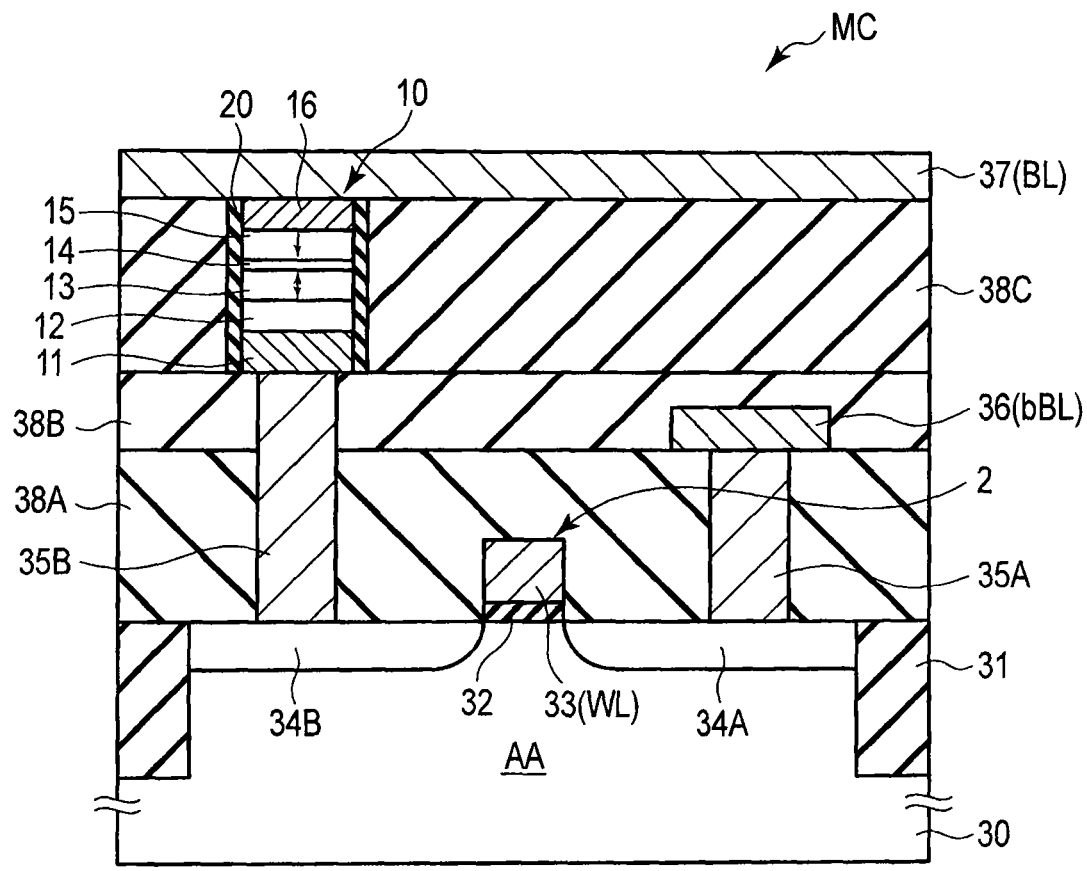
F I G. 9

MAGNETORESISTANCE ELEMENT AND MAGNETIC MEMORY

CROSS-REFERENCE TO RELATED APPLICATIONS

This application is based upon and claims the benefit of priority from Japanese Patent Application No. 2012-250338, filed Nov. 14, 2012, the entire contents of which are incorporated herein by reference.

FIELD

Embodiments described herein relate generally to a magnetoresistance element and a magnetic memory.

BACKGROUND

An MTJ (Magnetic Tunnel Junction) element is used as a magnetoresistance element of an MRAM (Magnetic Random Access Memory). An MTJ element contains magnetic materials and insulating materials, such as MgO. Therefore, the MTJ element is hardly processed by RIE (Reactive Ion Etching) using a halogen gas that is usually used in a semiconductor device field. When the RIE is used to process the MTJ element, a corrosion problem caused by a low corrosion resistance is generated. Additionally, unfortunately the etching cannot originally be performed to the MTJ element because the MTJ element contains many hardly-etched materials.

Therefore, as measures of the problems, ion milling in which an Ar ion of an inert gas is used is studied to process the MTJ element. However, in the ion milling in which the Ar ion is used, because an atom is physically flicked, a leak current is passed through a tunnel barrier layer of the MTJ element by re-adhesion of the spattered atom. Accordingly, in the ion milling of the MTJ element, dielectric breakdown becomes problematic due to a re-deposition layer, and the MTJ element free from a short circuit is hardly processed.

BRIEF DESCRIPTION OF THE DRAWINGS

FIG. 1 is a cross sectional view illustrating an MTJ element according to a first embodiment;

FIG. 2 is a cross sectional view illustrating another MTJ element of the first embodiment;

FIG. 8 is a block diagram showing a memory cell array and a circuit arrangement in the vicinity thereof according to a third embodiment; and FIG. 9 is a cross sectional view illustrating a memory cell of MRAM according to the third embodiment.

DETAILED DESCRIPTION

Figure 3A:
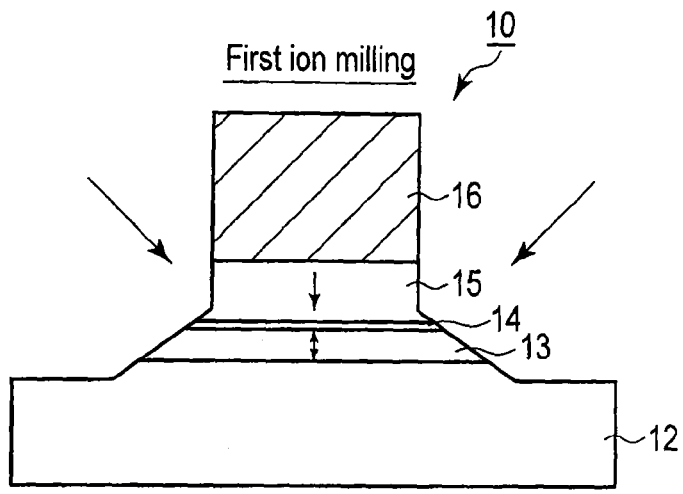
FIGS. 3A, 3B and 3C are cross sectional views showing manufacturing steps of the MTJ element of the first embodiment.

In general, according to one embodiment, a magnetoresistance element includes a first magnetic layer having a first surface and a second surface being opposite to the first surface; a second magnetic layer; an intermediate layer which is provided between the first surface of the first magnetic layer and the second magnetic layer; a first layer which is provided on the second surface of the first magnetic layer, the first layer containing B and at least one element selected from Hf, Al, Mg, and Ti and having a third surface and a fourth surface being opposite to the third surface, the third surface facing the second surface; a second layer which is provided on the fourth surface of the first layer, the second layer containing B and at least one element selected from Hf, Al, and Mg having a fifth surface and a sixth surface being opposite to the fifth surface, the fifth surface facing the fourth surface; and an insulating layer which is provided on a sidewall of the intermediate layer, the insulating layer containing at least one element selected from the Hf, Al, and Mg contained in the second layer.

Hereinafter, embodiments will be described with reference to the drawings. However, it is noted that the drawings are schematic and conceptual, and that a size, a ratio, and the like of each drawing are not always identical to the actual size, ratio, and the like. In the case that the same component is illustrated in the drawings, sometimes the size and the ratio vary. Particularly, the following embodiments illustrate a magnetic memory element in order to embody a technological thought of the present invention, but the technological thought of the present invention is not specified by a shape, a structure, a disposition, and the like of the component. In the following description, an element having the same function and configuration is designated by the same numeral, and repetitive description is made as needed basis.

[1] First Embodiment

[1-1] Configuration

A configuration of an MTJ element (a magnetoresistance element, and a magnetic memory element) 10 according to a first embodiment will be described with reference to FIGS. 1 and 2.

As illustrated in FIG. 1, the MTJ element 10 includes an underlayer 12, a memory layer 13, an intermediate layer 14, a reference layer 15, an upper electrode 16, and a deposition layer 20. The underlayer 12 includes a first underlayer 12A and a second underlayer 12B. The first underlayer 12A is adjacent to the memory layer 13. The second underlayer 12B is adjacent to an opposite surface to the surface of the first underlayer 12A adjacent to the memory layer 13. In the MTJ element 10 in FIG. 1, the second underlayer 12B, the first underlayer 12A, the memory layer 13, the intermediate layer 14, the reference layer 15, and the upper electrode 16 are stacked in this order. The deposition layer 20 is formed on sidewalls of the underlayer 12, the memory layer 13, the intermediate layer 14, and the reference layer 15.

A material in which the small spin pumping effect is reduced may be used as the first underlayer 12A. For example, the first underlayer 12A is formed while containing at least one element selected from a group consisting of Hf, Al, Mg and Ti and B. A boride (for example, HfB, AlB, MgB, TiB, HfAlTiB, HfAlB, HfMgB, and HfAlMgB) may be used as a material for the first underlayer 12A. When the material having the small spin pumping effect is used as the first underlayer 12A, a friction coefficient of the memory layer 13 is decreased to be able to reduce the write current.

A material to which the oxidation or the nitridation is easily performed when the second underlayer 12B is deposited on the sidewall of the intermediate layer 14 and a material that has the high breakdown voltage when the oxidation or the nitridation is performed may be used as the second underlayer 12B. For example, the second underlayer 12B is formed while containing at least one element selected from the group consisting of Hf, Al, and Mg and B. For example, HfB, AlB, MgB, HfAlB, HfMgB, and MgAlB may be used as a material for the second underlayer 12B. However, it is not always necessary that B be contained in the second underlayer 12B.

In this embodiment, because the underlayer 12 is constructed by the two layers (the first and second underlayers 12A and 12B), the first underlayer 12A is interposed between the second underlayer 12B and the memory layer 13. In this case, the second underlayer 12B is not limited to the material containing Hf, Al, Mg, and B as long as the second underlayer 12B becomes the insulator after being deposited on the sidewall of the intermediate layer 14.

Desirably the second underlayer 12B is thicker than the first underlayer 12A. This is because the surface of the lower electrode 11 is not exposed in patterning the MTJ element 10.

The deposition layer 20 is made of an insulating material containing at least one element identical to that contained in the second underlayer 12B. That is, the deposition layer 20 is made of an insulating material, which contains at least one element selected from the group consisting of Hf, Al, and Mg that are contained in the second underlayer 12B or an insulating material, which contains at least one element selected from the group consisting of Hf, Al, and Mg and B that are contained in the second underlayer 12B. Nitridation or oxidation is performed to a material constituting the second underlayer 12B, whereby the deposition layer 20 becomes insulated. That is, the deposition layer 20 is made of a material in which the material constituting the second underlayer 12B contains O (oxygen) or N (nitrogen). Examples of the oxygen-containing insulating materials for the deposition layer 20 include HfBO, AlBO, MgBO, HfAlBO, HfMgBO, and MgAlBO. Examples of the nitrogen-containing insulating materials for the deposition layer 20 include BN, MgN, AlN, AlBN, MgBN, and MgAlBN.

Each of the memory layer 13 and the reference layer 15 is made of a ferromagnetic material. In the case of the perpendicular magnetization type MTJ element 10 having perpendicular magnetic anisotropy, the memory layer 13 and the reference layer 15 have the magnetic anisotropy perpendicular to a film surface, and easy-axis-of-magnetization directions of the memory layer 13 and the reference layer 15 are oriented toward a direction perpendicular to the film surface.

For example, CoFeB having a film thicknesses of about 1.0 to about 1.4 nm may be used as the memory layer 13.

For example, an artificial lattice in which TbCoFe, Co, and Pt are stacked or a crystalline film in which FePt is order in L10 may be used as the reference layer 15. Polarizability of the reference layer 15 is improved by sandwiching CoFeB between the reference layer 15 and the intermediate layer 14 to be able to obtain a high MR ratio (magnetoresistance ratio).

The intermediate layer 14 is made of nonmagnetic materials, such as a nonmagnetic metal, a nonmagnetic semiconductor, and an insulator. For example, MgO having a film thickness of about 1 nm may be used as the intermediate layer 14. MgO is used as the intermediate layer 14 to be able to obtain the high MR ratio.

In addition to a function of an electrode, the upper electrode 16 is used as a mask in patterning the MTJ element 10. Therefore, desirably a material having a low electric resistance and a diffusion-tolerance and a material having an excellent etching-tolerance or ion-milling-tolerance are used as the upper electrode 16. For example, a stacked film of Ta/Ru is used as the upper electrode 16.

As illustrated in FIG. 2, the MTJ element 10 may include a lower electrode 11 below the second underlayer 12B. Desirably the material having the low electric resistance and the diffusion-tolerance is used as the lower electrode 11. For example, a stacked film of Ta/Cu/Ta is used as the lower electrode 11, Cu is used to reduce the electric resistance of the lower electrode 11, and Ta is used to improve the diffusion-tolerance.

In the MTJ element 10 in FIG. 2, a lower portion of the second underlayer 12B and the lower electrode 11 are wider than an upper portion of the second underlayer 12B, the first underlayer 12A, the memory layer 13, the intermediate layer 14, the reference layer 15, and the upper electrode 16. The deposition layer 20 is formed on sidewalls of the upper portion of the second underlayer 12B, the first underlayer 12A, the memory layer 13, the intermediate layer 14, the reference layer 15, and the upper electrode 16 and the lower portion of the second underlayer 12B.

[1-2] Production Method

Figure 3B:
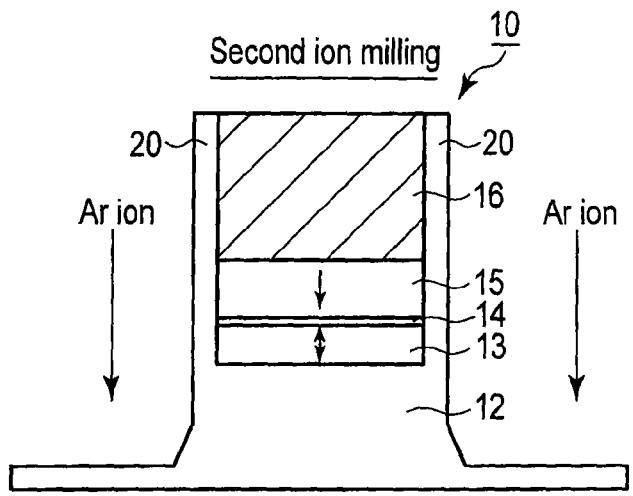
Figure 3C:
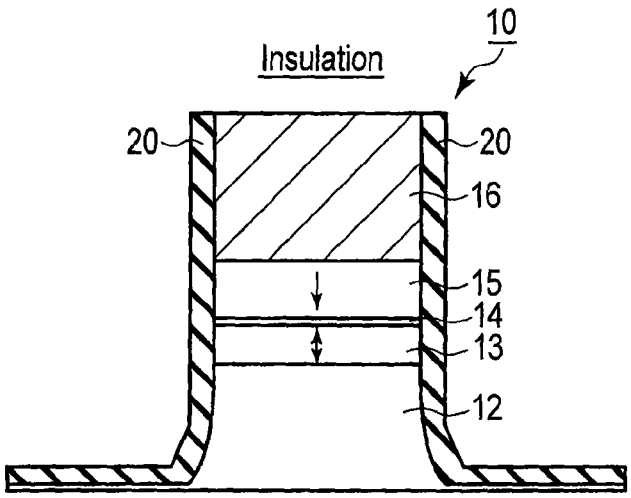

An example of a process of forming the MTJ element 10 of the first embodiment will be described with reference to FIGS. 3A to 3C. In FIGS. 3A to 3C, the first underlayer 12A and the second underlayer 12B are illustrated as the underlayer 12 which has them for simplification.

As illustrated in FIG. 3A, the underlayer 12, the memory layer 13, the intermediate layer 14, the reference layer 15, and the upper electrode 16 are sequentially stacked. Then first ion milling is performed to process the MTJ element 10. The first ion milling is performed using inert gases (in the first embodiment, an Ar ion), such as Ar, Kr, and Xe. In the first ion milling, an incident angle of an ion is adjusted to an inclined direction (for example, a direction inclined by about 50° to a direction perpendicular to a film surface of the MTJ element 10) such that the deposition layer 20 is not formed on the sidewall of the intermediate layer 14. The first ion milling is performed until the upper portion of the underlayer 12 (for example, the second underlayer 12B) is processed.

As illustrated in FIG. 3B, the incident angle of the Ar ion is changed to the direction perpendicular to the film surface, and second ion milling is performed. In the second ion milling, the ion milling is further performed to the underlayer 12. As a result, part of the underlayer 12 (for example, the second underlayer 12B) to which the ion milling is performed by the Ar ion is deposited on the sidewall of the MTJ element 10 to form the deposition layer 20. In the second ion milling, desirably the incident direction of the ion is closer to the direction perpendicular to the film surface of the MTJ element 10 than the incident direction of the ion of the first ion milling.

As illustrated in FIG. 3C, the oxidation or the nitridation is performed to the deposition layer 20 deposited on the sidewall of the MTJ element 10, thereby forming the insulated deposition layer 20.

At this point, the oxidation of the deposition layer 20 is performed by exposing the deposition layer 20 to an atmosphere. However, the oxidation of the deposition layer 20 can be performed other than the exposure of the deposition layer 20 to the atmosphere. For example, in vacuum, the deposition layer 20 can sufficiently be oxidized by exposing the deposition layer 20 to an oxygen gas, a radical oxygen, a plasma oxygen, or a cluster oxygen ion.

For example, the nitridation of the deposition layer 20 is performed using a radical nitrogen, a plasma nitrogen, or a cluster nitrogen ion.

The oxidation or the nitridation of the deposition layer 20 may be performed irrespective of a valence state as long as an insulating property is ensured.

[1-3] Material for Deposition Layer 20

The underlayer 12 contains (i) at least one element selected from the group consisting of Hf, Al, and Mg and (ii) B. Desirably the deposition layer 20 is made of an insulating material containing at least (i) in (i) and (ii) constituting the second underlayer 12B. In the case that the deposition layer 20 is made of a nitride, the deposition layer 20 may be made of an insulating material containing at least (ii) in (i) and (ii) constituting the second underlayer 12B. The detailed description will be made below.

When the deposition layer 20 deposited on the sidewall of the intermediate layer 14 has a conductive property, a current is passed through the sidewall of the intermediate layer 14 to generate a trouble of a short circuit. In order to prevent the trouble of a short circuit, desirably the deposition layer 20 has resistivities of 0.0005 $\Omega cm^2$ or more. Even if the metal deposited on the intermediate layer 14 is insulated by the oxidation, when a breakdown-voltage-tolerance of the insulating layer is lower than that of the intermediate layer 14, a dielectric strength voltage is lowered to degrade an insulating property of repetitive read/write of the MTJ element 10. That is, desirably the material for the deposition layer 20 deposited on the sidewall of the intermediate layer 14 is a material of the same sort of the intermediate layer 14 or a material, which has the high dielectric-breakdown-tolerance when being oxidized. When MgO or MgO containing B is used as the intermediate layer 14, a breakdown voltage ranges from about 5 to about 20 MV/cm. Therefore, desirably the deposition layer 20 is made of MgO or MgBO or a material, in which the breakdown voltage becomes 5 MV/cm or more by the oxidation. Desirably an oxide, in which the material made by the combination of at least one element selected from the group consisting of Hf, Al, and Mg and B is oxidized, is used as the deposition layer 20.

In the process in FIG. 3C in which the deposition layer 20 is insulated by the oxidation, it is necessary to expose the deposition layer 20 to the oxygen gas, the radical oxygen, or the plasma oxygen. In the oxidation process of the deposition layer 20, when an oxygen content is excessively high, the memory layer 13 or the reference layer 15 is oxidized to degrade a magnetic property. Undesirably the degradation of the magnetic property causes the degradation of a thermal-agitation-tolerance. In the oxidation process of oxidizing the deposition layer 20, it is desirable that the deposition layer 20 can completely be oxidized although the magnetic material is not oxidized. That is, it is necessary that the deposition layer 20 be easily oxidized compared with the memory layer 13 or the reference layer 15.

Figure 4:
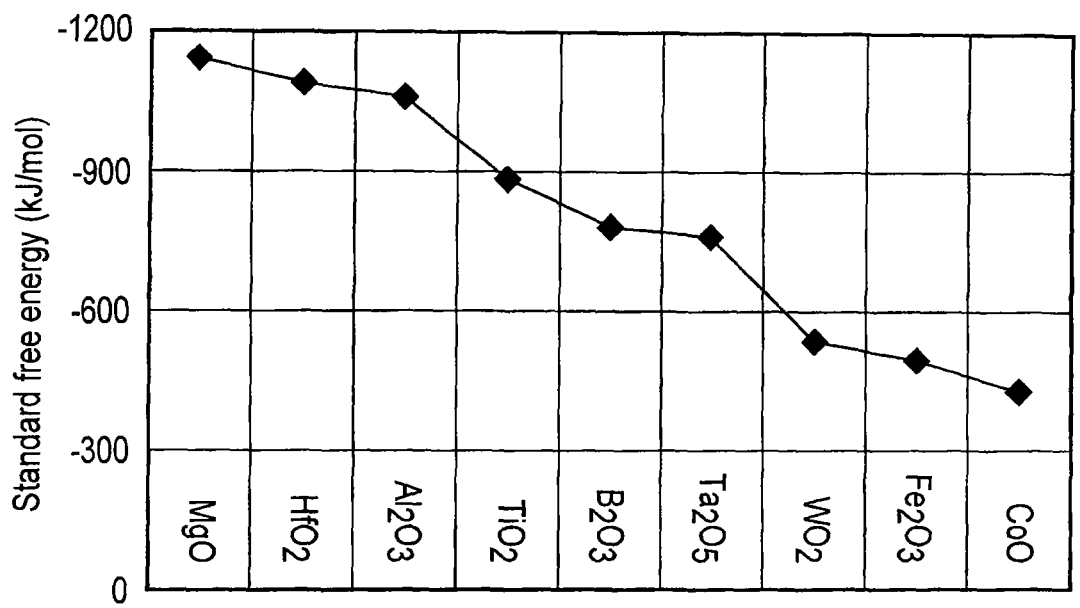
FIG. 4 is a view illustrating standard free energy in the first embodiment when an oxide of various materials is made.

As illustrated in FIG. 4, standard free energy AG (kJ/mol) of oxides of various materials (Mg, Hf, Al, Ti, B, Ta, W, Fe, and Co) varies. Magnesium oxide (MgO), hafnium oxide ($HfO_2$), aluminum oxide ($Al_2O_3$) has large negative standard free energy during the formation of the oxide. It is found that Mg, Hf, and Al are easily coupled to oxygen compared with Fe and Co that are mainly used in the memory layer 13 and the reference layer 15.

The material mainly containing Mg, Hf, or Al is deposited on the sidewall of the MTJ element 10, and the deposition layer 20 is weakly oxidized at a degree at which the memory layer 13 and the reference layer 15 are not oxidized, for example, only exposure of the deposition layer 20 to the oxygen gas. Therefore, the deposition layer 20 can sufficiently be oxidized, and the deposition layer 20 can becomes the good insulator.

The deposition layer 20 may be insulated by the nitridation. In this case, the resistance of the deposition layer 20 can be increased while an oxidation damage to the magnetic material is suppressed.

BN, MgN, and AlN are insulators having the good dielectric-breakdown-tolerance. Therefore, using the material mainly containing Mg, Al, or B as the underlayer 12, Mg, Al, or B is deposited on the sidewall of the intermediate layer 14 by the ion milling of the MTJ element 10, and the nitridation is performed to produce the MTJ element 10 free from the insulation defect.

Fe and Co used in the memory layer 13 have weak reactivity with nitrogen compared with oxygen. That is, when the material to which the nitridation is easily performed and the material having the good insulating property and breakdown-resistant voltage property after the nitridation are used as the deposition layer 20, the deposition layer 20 can be insulated by the nitridation while the degradation of the magnetic property due to the nitridation of the memory layer 13 or reference layer 15 is suppressed.

[1-4] Effect

According to the first embodiment, the second underlayer 12B of the MTJ element 10 is made of the material containing at least one element selected from the group consisting of Hf, Al, and Mg and B. In the ion milling of the MTJ element 10, some atoms sputtered from the second underlayer 12B are deposited on the sidewall of the MTJ element 10. The deposition layer is insulated to form the deposition layer 20, which is made of the insulator containing the element constituting the second underlayer 12B, on the sidewall of the MTJ element 10.

In the materials constituting the deposition layer 20, Hf, Al, or Mg are easily oxidized compared with the materials for the memory layer 13 and the reference layer 15, and the oxide of Hf, Al, or Mg has the high dielectric-breakdown-tolerance. In the materials constituting the deposition layer 20, the nitridation is easily performed to B, Al, or Mg compared with the materials for the memory layer 13 and the reference layer 15, and the nitride of B, Al, or Mg has the high dielectric-breakdown-tolerance. Additionally, B is contained in the material constituting the second underlayer 12B, so that a spin pumping effect can be suppressed to implement low-current write. Therefore, according to the first embodiment, the MTJ element 10 free from the insulating defect can be constructed.

Figure 5:
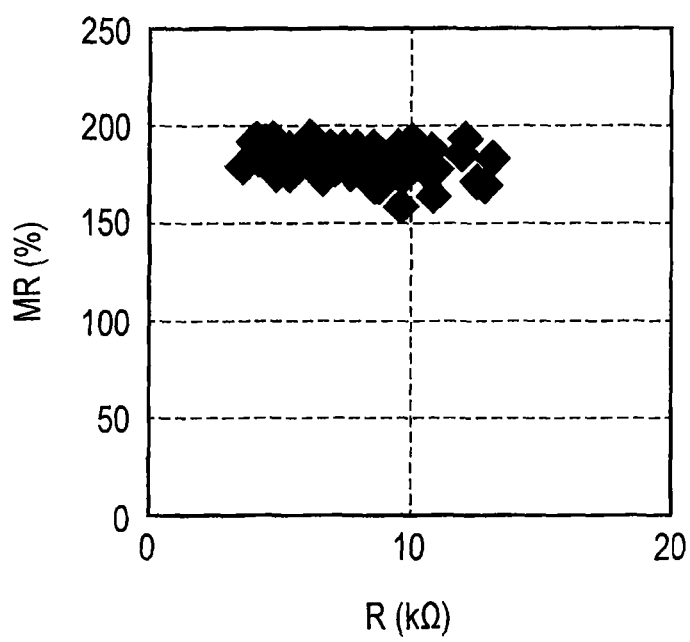
FIG. 5 is a view illustrating a correlation between a resistance (R) and a rate of resistance change (MR) of the MTJ element that is produced using the process in FIG. 3.

Generally, when the conductive property is left in the deposition layer 20 deposited on the sidewall of the intermediate layer 14, a MR ratio of the MTJ element decreases with decreasing resistance R of the MTJ element 10. On the other hand, in the first embodiment, as can be seen from FIG. 5, a MR ratio of the MTJ element does not decrease at the low resistance R, and the degradation of the MR ratio due to the insulation defect of the deposition layer 20 is not generated.

According to the first embodiment, the first underlayer 12A is formed while containing at least one element selected from a group consisting of Hf, Al, Mg and Ti and B. When the material having the small spin pumping effect is used as the first underlayer 12A, the low dumping is realized, a friction coefficient of the memory layer 13 is decreased to be able to reduce the write current. Furthermore, when the first underlayer 12A is formed by a boride (for example, HfB), in comparison with the case where the first underlayer 12A is formed by a nitride, a TMR ratio increases about twice.

In addition, it is possible to make reverse the order of lamination of the first underlayer 12A and the second underlayer 12B that construct the underlayer 12, and to also make the second underlayer 12B adjoin the memory layer 13.

[2] Second Embodiment

A second embodiment is an example in which three underlayers 12 are formed. In the second embodiment, the same description as the first embodiment is omitted.

[2-1] Configuration

A configuration of the MTJ element 10 of the second embodiment will be described with reference to FIGS. 6 and 7.

Figure 6:
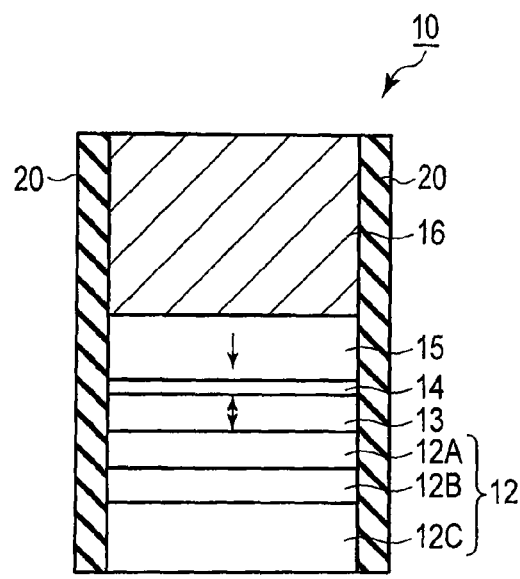
FIG. 6 is a cross sectional view illustrating an MTJ element according to a second embodiment.
Figure 7:
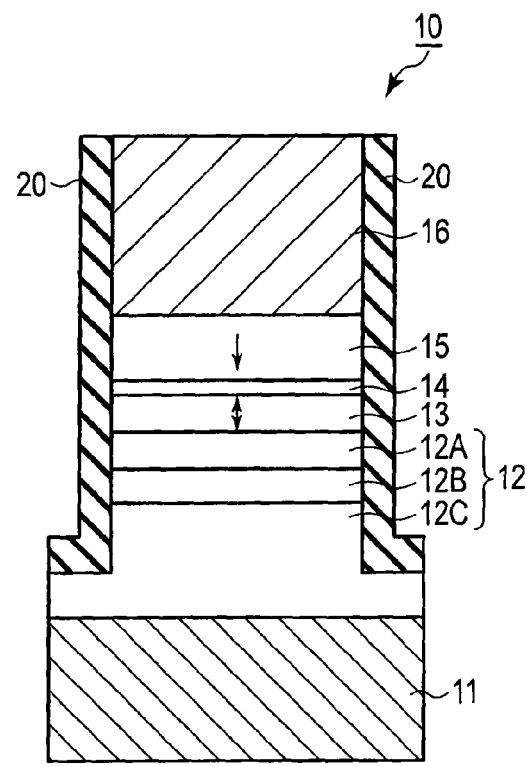
FIG. 7 is a cross sectional view illustrating another MTJ element of the second embodiment.

As illustrated in FIGS. 6 and 7, in the second embodiment, the underlayer 12 includes a first underlayer 12A, a second underlayer 12B and a third underlayer 12C. The first underlayer 12A is adjacent to the memory layer 13. The second underlayer 12B is formed between the first underlayer 12A and the third underlayer 12C.

The first underlayer 12A and the second underlayer 12B are formed with the same material as the first embodiment.

The third underlayer 12C is formed including B. The third underlayer 12C may be formed while containing at least one element selected from the group consisting of Hf, Al, Mg, Ti, Ta, Mn, Zr, Ca, Sr, Y, Ba, La, Ce, Sm, Eu, and Yb and B. For example, a boride (for example, HfB, AlB, MgB, TiB, TaB, MnB, ZrB, CaB, SrB, YB, BaB, LaB, CeB, SmB, EuB, YbB, HfAlTiB, HfAlB, HfMgB, and HfAlMgB) may be used as a material for the third underlayer 12C.

[2-2] Effect

In the second embodiment, not only the same effect as the first embodiment can be obtained, but also the following effect can also be obtained.

In the MTJ element having the low resistance, in order to get a high TMR ratio, the planarization of the underlayer is indispensable. This is because the tunnel barrier layer having a high crystalline cannot be formed if the underlayer has unevenness.

Accordingly, in the second embodiment, the third underlayer 12C formed by for example a boride is arranged to adjoin the second underlayer 12B. Thereby, since the planarization of the underlayer 12 can be carried out, a flat layer can be formed on the underlayer 12. As a result, a TMR ratio higher than the first embodiment can be got.

Moreover, it can control that boron in the second underlayer 12B falls out to the third underlayer 12C by forming the third underlayer 12C including boron. Accordingly, a high insulation can be maintained if the insulation is performed to the deposition layer deposited on the sidewall of the intermediate layer 14 by processing of the MTJ element 10. As a result, the magnetic thermal-agitation-tolerance of the memory layer 13 can be maintained rather than the first embodiment.

Furthermore, it is controlled that boron in the second underlayer 12B falls out to the third underlayer 12C. Thereby, if CoFeB is used for the memory layer 13, it can control that boron falls out to the second underlayer 12B and the third underlayer 12C also to CoFeB of the memory layer 13. The boron concentration in CoFeB influences the magnitude of magnetic anisotropy. Therefore, by inserting the third underlayer 12C, composition of CoFeB adjusted the optimal as a result is maintainable. As a result, the degradation of the magnetic anisotropy perpendicular to a film surface can be controlled, and the magnetic thermal-agitation-tolerance of the memory layer 13 can be maintained rather than the first embodiment.

[3] Third Embodiment

In a third embodiment, an application example of the magnetoresistive element 10 according to the embodiments will be described. The magnetoresistive element 10 of the above-described embodiments is used as a memory element of a magnetic memory, for example, an MRAM (Magnetoresistive Random Access Memory). In this embodiment, an STT MRAM (Spin-torque transfer MRAM) will be exemplified. Note that the same reference numerals as in the above-described embodiment denote the same components, and a description thereof will be made as needed.

[3-1] Circuit Arrangement

A block diagram showing a memory cell array of the third embodiment and a circuit arrangement in the vicinity thereof will be described with reference to FIG. 8.

As shown in FIG. 8, a memory cell array MCA includes a plurality of memory cells MC. The plurality of memory cells MC are arranged as an array in the memory cell array MCA. A plurality of bit lines BL and bBL and a plurality of word lines WL are provided in the memory cell array MCA. The bit lines BL and bBL run in the column direction. The word lines WL run in the row direction. The two bit lines BL and bBL form a bit line pair.

The memory cells MC are connected to the bit lines BL and bBL and the word lines WL. The plurality of memory cells MC arrayed in the column direction are connected to the common pair of bit lines BL and bBL. The plurality of memory cells MC arrayed in the row direction are connected to the common word line WL.

Each memory cell MC includes, for example, one MTJ element 10 serving as a memory element and one select switch 2. The MTJ element 10 described in the first or second embodiment is used as the MTJ element 10 in the memory cell MC.

The select switch 2 is, for example, a field effect transistor. The field effect transistor serving as the select switch 2 will be referred to as the select transistor 2 hereinafter.

The MTJ element 10 has one terminal connected to the bit line BL and the other terminal connected to one end (source/drain) of the current path of the select transistor 2. The other end (drain/source) of the current path of the select transistor 2 is connected to the bit line bBL. The control terminal (gate) of the select transistor 2 is connected to the word line WL.

One end of each word line WL is connected to a row control circuit 4. The row control circuit 4 controls activation/inactivation of the word lines based on an external address signal.

Column control circuits 3A and 3B are connected to one end and the other end of each of the bit lines BL and bBL. The column control circuits 3A and 3B control activation/inactivation of the bit lines BL and bBL based on an external address signal.

Writing circuits 5A and 5B are connected to one end and the other end of each of the bit lines BL and bBL via the column control circuits 3A and 3B. The writing circuits 5A and 5B include a source circuit such as a current source or voltage source to generate a write current and a sink circuit to absorb the write current, respectively.

In the STT MRAM, at the time of data write, the writing circuits 5A and 5B supply a write current to an externally selected memory cell (to be referred to as a selected cell hereinafter).

When writing data to the MTJ element 10, the writing circuits 5A and 5B bidirectionally supply a write current to the MTJ element 10 in the memory cell MC in accordance with data to be written to the selected cell. That is, the writing circuits 5A and 5B output a write current from the bit line BL to the bit line bBL or a write current from the bit line bBL to the bit line BL in accordance with data to be written to the MTJ element 10.

A reading circuit 6A is connected to one end of each of the bit lines BL and bBL via the column control circuit 3A. The reading circuit 6A includes a current source or voltage source to generate a read current, a sense amplifier that detects and amplifies a read signal, and a latch circuit for temporarily holding data. When reading data from the MTJ element 10, the reading circuit 6A supplies a read current to the selected cell. The current value of the read current is smaller than the current value (magnetization reversal threshold) of the write current so the magnetization of the recording layer is not reversed by the read current.

The current value or potential of the read node changes depending on the magnitude of the resistance value of the MTJ element 10 to which the read current is supplied. Data stored in the MTJ element 10 is discriminated based on a variation amount (read signal, read output) corresponding to the magnitude of the resistance value.

In the example shown in FIG. 8, the reading circuit 6A is provided on one end side in the column direction. However, two reading circuits may be provided at one end and the other end, respectively.

For example, circuits (to be referred to as peripheral circuits hereinafter) other than the row/column control circuits, the writing circuits, and the reading circuit are provided in the same chip as that of the memory cell array MCA. For example, a buffer circuit, a state machine (control circuit), or an ECC (Error Checking and Correcting) circuit may be provided in the chip as a peripheral circuit.

[3-2] Sectional Structure

An example of the structure of the memory cell MC provided in the memory cell array MCA of the MRAM according to the third embodiment will be described with reference to FIG. 9.

As illustrated in FIG. 9, the memory cell MC is formed in an active region AA of a semiconductor substrate 30. The active region AA is defined by an insulating film 31 buried in the element isolation region of the semiconductor substrate 30.

The upper end of the MTJ element 10 is connected to a bit line 37 (BL) via an upper electrode 16. The lower end of the MTJ element 10 is connected to a source/drain diffusion layer 34B of the select transistor 2 via a lower electrode 11 and a contact plug 35B. A source/drain diffusion layer 34A of the select transistor 2 is connected to a bit line 36 (bBL) via a contact plug 35A.

A gate electrode 33 is formed on a gate insulating film 32 on the surface of the active region AA between the source/drain diffusion layer 34A and the source/drain diffusion layer 34B. The gate electrode 33 runs in the row direction and is used as the word line WL.

The MTJ element 10 is formed immediately above the contact plug 35B. However, it may be arranged at a position (for example, above the gate electrode 33 of the select transistor 2) shifted from immediately above the contact plug 35B using an intermediate interconnection layer.

FIG. 9 illustrates an example in which one memory cell is provided in one active region AA. However, two memory cells may be provided in one active region AA so as to be adjacent in the column direction while sharing one bit line 36 (bBL) and the source/drain diffusion layer 34A. The cell size of the memory cell MC is thus reduced.

FIG. 9 shows a field effect transistor having a planar structure as the select transistor 2. However, the structure of the field effect transistor is not limited to this. For example, a field effect transistor having a 3D structure such as an RCAT (Recess Channel Array Transistor) or Fin FET may be used as the select transistor. In the RCAT, the gate electrode is buried on a gate insulating film in a trench (recess) in a semiconductor region. In the Fin FET, the gate electrode and a strip-shaped semiconductor region (fin) cross each other on different levels while sandwiching a gate insulating film between them.

[3-3] Effect

According to the third embodiment, the operation characteristic of the MRAM can be improved by forming the MRAM using the MTJ element 10 according to the first or second embodiment.

[4] Others

In the embodiments, B, N, O, or C may be mixed in the "nitride" and the "oxide", and the "nitride" and the "oxide" may be a "nitrogen inclusion" and an "oxygen inclusion".

In the embodiments, the magnetic layer adjacent to the underlayer 12 is the memory layer 13. Alternatively, the dispositions of the memory layer 13 and the reference layer 15 can be switched.

In the embodiments, the deposition layer 20 is formed on all the sidewalls of the underlayer 12, the memory layer 13, the intermediate layer 14, and the reference layer 15. Alternatively, the deposition layer 20 may be formed on at least the sidewall of the intermediate layer 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistance element comprising:
   a first magnetic layer having a first surface and a second surface being opposite to the first surface;
   a second magnetic layer;
   an intermediate layer which is provided between the first surface of the first magnetic layer and the second magnetic layer;
   a first layer which is provided on the second surface of the first magnetic layer, the first layer containing B and at least one element selected from Hf, Al, Mg, and Ti and having a third surface and a fourth surface being opposite to the third surface, the third surface facing the second surface;
   a second layer which is provided on the fourth surface of the first layer, the second layer containing B and at least one element selected from Hf, Al, and Mg and having a fifth surface and a sixth surface being opposite to the fifth surface, the fifth surface facing the fourth surface; and
   an insulating layer which is provided on a sidewall of the intermediate layer, the insulating layer containing at least one element selected from the Hf, Al, and Mg contained in the second layer.

2. The element according to claim 1, further comprising:
   a third layer which is provided on the sixth surface of the second layer and contains B.

3. The element according to claim 2, wherein the third layer further contains at least one element selected from Hf, Al, Mg, Ti, Ta, Mn, Zr, Ca, Sr, Y, Ba, La, Ce, Sm, Eu, and Yb.

4. The element according to claim 1, wherein the second layer is thicker than the first layer.

5. The element according to claim 1, wherein the first magnetic layer is a memory layer.

6. The element according to claim 1, wherein the insulating layer further contains B.

7. A magnetic memory comprising a memory cell having a magnetoresistance element, the magnetoresistance element comprising:
- a first magnetic layer having a first surface and a second surface being opposite to the first surface;
- a second magnetic layer;
- an intermediate layer which is provided between the first surface of the first magnetic layer and the second magnetic layer;
- a first layer which is provided on the second surface of the first magnetic layer, the first layer containing B and at least one element selected from Hf, Al, Mg, and Ti and having a third surface and a fourth surface being opposite to the third surface, the third surface facing the second surface;
- a second layer which is provided on the fourth surface of the first layer, the second layer containing B and at least one element selected from Hf, Al, and Mg and having a fifth surface and a sixth surface being opposite to the fifth surface, the fifth surface facing the fourth surface; and
- an insulating layer which is provided on a sidewall of the intermediate layer, the insulating layer containing at least one element selected from the Hf, Al, and Mg contained in the second layer.

8. The memory according to claim 7, further comprising:
a third layer which is provided on the sixth surface of the second layer and contains B.

9. The memory according to claim 8, wherein the third layer further contains at least one element selected from Hf, Al, Mg, Ti, Ta, Mn, Zr, Ca, Sr, Y, Ba, La, Ce, Sm, Eu, and Yb.

10. The memory according to claim 7, wherein the second layer is thicker than the first layer.

11. The memory according to claim 7, wherein the first magnetic layer is a memory layer.

12. The memory according to claim 7, wherein the insulating layer further contains B.

13. A magnetic memory comprising a memory cell having a magnetoresistance element, the magnetoresistance element comprising:
- a first magnetic layer;
- a first layer containing B and at least one element selected from Hf, Al, and Mg;
- a second magnetic layer which is provided between the first magnetic layer and the first layer;
- an intermediate layer which is provided between the first magnetic layer and the second magnetic layer;
- a second layer which is provided between the second magnetic layer and the first layer, the second layer containing B and at least one element selected from Hf, Al, Mg, and Ti; and
- an insulating layer which is provided on a sidewall of the intermediate layer, the insulating layer containing at least one element selected from the Hf, Al, and Mg contained in the first layer.

14. The memory according to claim 13, further comprising:
a third layer contains B, the first layer being provided between the third layer and the second layer.

15. The memory according to claim 14, wherein the third layer further contains at least one element selected from Hf, Al, Mg, Ti, Ta, Mn, Zr, Ca, Sr, Y, Ba, La, Ce, Sm, Eu, and Yb.

16. The memory according to claim 13, wherein the first layer is thicker than the second layer.

17. The memory according to claim 13, wherein the second magnetic layer is a memory layer.

18. The memory according to claim 13, wherein the insulating layer further contains B.

* * * * *